US007969449B2

(12) United States Patent
Moldvai et al.

(10) Patent No.: US 7,969,449 B2
(45) Date of Patent: Jun. 28, 2011

(54) SYSTEMS AND METHODS FOR COLOR CONTROL OF DISPLAY DEVICES

(75) Inventors: Caba Moldvai, Dublin, CA (US); Mathew D. Halfant, San Jose, CA (US); Zisheng Le, San Jose, CA (US)

(73) Assignee: Tamiras Per Pte. Ltd., LLC, Dover, DE (US)

( * ) Notice: Subject to any disclaimer, the term of this patent is extended or adjusted under 35 U.S.C. 154(b) by 923 days.

(21) Appl. No.: 11/874,167

(22) Filed: Oct. 17, 2007

(65) Prior Publication Data

US 2009/0195486 A1 Aug. 6, 2009

Related U.S. Application Data

(60) Provisional application No. 60/895,691, filed on Mar. 19, 2007, provisional application No. 60/829,985, filed on Oct. 18, 2006.

(51) Int. Cl.

| | |
|---|---|
| ***G09G 3/30*** | (2006.01) |
| ***G09G 5/00*** | (2006.01) |
| ***G09G 5/02*** | (2006.01) |
| ***H04N 5/57*** | (2006.01) |
| ***H04N 9/73*** | (2006.01) |
| ***H04N 1/46*** | (2006.01) |
| ***G06K 9/00*** | (2006.01) |
| *G09G 1/28* | (2006.01) |
| *G06T 11/20* | (2006.01) |
| *H04N 9/64* | (2006.01) |
| *G03F 3/08* | (2006.01) |
| *G06K 9/20* | (2006.01) |

(52) U.S. Cl. ........ 345/589; 345/581; 345/619; 345/428; 345/77; 348/242; 348/602; 348/655; 348/687; 358/504; 358/509; 358/519; 382/165; 382/169; 382/312

(58) Field of Classification Search .................. 345/426, 345/428, 581, 589–593, 600, 88, 601, 606, 345/618–619, 10–11, 22, 63, 77, 83, 89; 348/180, 196, 242–244, 253–254, 602, 655, 348/658, 687, 671–675; 358/504, 509, 514–519
See application file for complete search history.

(56) References Cited

U.S. PATENT DOCUMENTS

| | | | | |
|---|---|---|---|---|
| 5,644,367 | A | 7/1997 | Yu | |
| 5,762,823 | A * | 6/1998 | Hikmet | 252/299.01 |
| 5,979,763 | A * | 11/1999 | Wang et al. | 235/462.17 |
| 6,522,313 | B1 | 2/2003 | Cottone | |
| 7,136,076 | B2 | 11/2006 | Evanicky | |
| 7,164,284 | B2 | 1/2007 | Pan | |
| 2003/0020725 | A1 | 1/2003 | Matsuda | |
| 2006/0158411 | A1 | 7/2006 | Sakashita | |

(Continued)

OTHER PUBLICATIONS

Gibson, Jason E., Colorimetric Characterization of Three Computer Displays (LCD and CRT), Munsell Color Science Laboratory Technical Report, Munsell Color Science Laboratory, Rochester, NY (Jan. 2000). Wen Senfar, et al., Two-Primary Crosstalk Model for Characterizing Liquid Crystal Displays, Color Research and Application, vol. 31, No. 2, Apr. 2006, pp. 102-108.
Day, Ellen, Colorimetric Characterization of a Computer-Controlled (SGI) CRT Display, Munsell Color Science Laboratory, A Joint Research Program of the National Gallery of Art, Washington, The Museum of Modern Art, New York, Rochester Institute of Technology, Technical Report, Apr. 2002.

* cited by examiner

*Primary Examiner* — Wesner Sajous

(74) *Attorney, Agent, or Firm* — Christensen O'Connor Johnson Kindness PLLC

(57) ABSTRACT

Various techniques for implementing aspects of color control in display devices are disclosed. One exemplary technique includes measuring an input/output profile of a display, then applying a mathematical model to the display's measured profile to generate color control tables. One exemplary technique may include tracking a first color temperature below a high-luminosity transition point and gradually transitioning to tracking a second color temperature above the high-luminosity transition point. One exemplary technique may also include gradually transitioning from tracking a darklight color temperature below a low-luminosity transition point to tracking the first color temperature above the low-luminosity transition point. Another exemplary technique may include tracking a response curve for a specified chromaticity above a low-luminosity transition point.

26 Claims, 5 Drawing Sheets

320

COLOR CONTROL TABLE GENERATOR INPUT PARAMETERS

| | |
|---|---|
| TEMP | DESIRED COLOR TEMPERATURE |
| WPTEMP | HIGH-LUMINOSITY COLOR TEMPERATURE |
| ALPHA | LOW-LUMINOSITY TRANSITION POINT |
| BETA | HIGH-LUMINOSITY TRANSITION POINT |
| HWID | PLANCKIAN LOCUS SEARCH DISTANCE |
| CHROM | CHROMATICITY |
| GAMMA | GAMMA CURVE VALUE |
| GAMFILE | DIRECT GAMMA CURVE INPUT FILE |
| TLEN | COLOR CONTROL TABLE LENGTH |
| NBITS | COLOR CONTROL TABLE BIT-WIDTH |
| NUMSEGS | COLOR CONTROL TABLE SMOOTHING CONTROL |

FIG. 5

SYSTEMS AND METHODS FOR COLOR CONTROL OF DISPLAY DEVICES

CLAIM OF PRIORITY

This patent application claims priority under 35 U.S.C. section 119(e) to (i) U.S. Provisional Patent Application No. 60/895,691, filed on Mar. 19, 2007 entitled "SYSTEMS AND METHODS FOR COLOR CONTROL OF DISPLAY DEVICES," and (ii) U.S. Provisional Patent Application No. 60/829,985, filed on Oct. 18, 2006, entitled "DISPLAY RECHARACTERIZATION VIA GAMMA LOOK-UP-TABLE (LUT)," both of which are hereby incorporated by reference herein in their entirety.

BACKGROUND OF THE INVENTION

1. Technical Field of the Invention

Implementations consistent with the principles of the invention generally relate to the field of display devices, more specifically to color control of display devices such as display panels.

2. Background of Related Art

Liquid crystal displays ("LCDs") are display devices often used in computers, televisions, and multimedia monitors. In such displays, much like cathode ray tube ("CRT") displays, an individual picture element (or "pixel") that appears to a viewer to be white is actually composed of red, green and blue ("RGB") primary color components. When each primary color component of the pixel is excited simultaneously and with the appropriate energy, white (or substantially white) can be perceived by the viewer at the pixel screen position. To produce different apparent colors at the same pixel location, the intensity to which the red, green and blue primary components are driven is altered in well known fashions. The separate red, green and blue data that corresponds to the color intensities of a particular pixel is called the pixel's RGB color data (and is sometimes called gray scale data in the case where the red, blue, and green components are constrained to be nearly equal). The degree to which different colors can be achieved within a pixel is referred to as gray scale resolution. Gray scale resolution is directly related to the amount of different intensities, or shades, to which each red, green and blue point can be driven.

The native color temperature of a display device may be observed by having the device display a gray-scale ramp, which results from presenting inputs with equal R, G, and B components which increase in intensity, in unison, from minimum to maximum value while proceeding from left to right across the display screen. Standard measurement apparatus will then report the Correlated Color Temperature ("CCT"), which may not be the same at all points of the ramp. In order to secure a constant, and user-specified, CCT, each of the three input channels may be mapped by use of color control tables, as described herein. It may be noted that, after mapping, the R, G, B triplets will no longer be necessarily equal, and generally only one of the three will reach its former maximum value at the top of the intensity ramp: B, for example, to give the white a blueish cast; R for a reddish cast.

The white balance adjustment for a display is important because many users want the ability to alter the display's color temperature for a variety of different reasons. For instance, the color temperature might be varied based on a viewer's personal taste. In other situations, color temperature adjustment may be needed to compensate for manufacturing variations in the display. Color critical applications such as pre-press soft proofing, desktop publishing, graphics design, medical imaging, digital photography, and video editing require white balance values and gamma values of different displays to be matched so as to accurately view and exchange images with confidence. Color temperature tracking (sometimes also called gray scale tracking) relates to the ability of a display to maintain the same color temperature as the intensity of light changes.

A gamma characteristic is a power-law nonlinear relationship that approximates the relationship between the encoded luminance in a display system and the actual desired image brightness. With this nonlinear relationship, equal steps in encoded luminance correspond to subjectively approximately equal steps in brightness. Display systems that require a linear relationship between these quantities use gamma correction techniques, as skilled artisans recognize.

It is desirable to address the limitations in the art.

BRIEF SUMMARY OF THE INVENTION

Various methods, systems, and apparatus for implementing aspects of color control in display devices are disclosed. One such method includes measuring an input/output profile of a display, then applying a mathematical model to the display's measured profile to generate color control tables. One such method may include tracking a first color temperature below a high-luminosity transition point and gradually transitioning to tracking a second color temperature above the high-luminosity transition point. One such method may also include gradually transitioning from tracking a darklight color temperature below a low-luminosity transition point to tracking the first color temperature above the low-luminosity transition point. Another such method may include tracking a response curve for a specified chromaticity above a low-luminosity transition point. One apparatus according to aspects of the present invention includes means for measuring an input/output profile of a display, and means for applying a mathematical model to the display's measured profile to generate color control tables. One such apparatus may include means for tracking a first color temperature below a high-luminosity transition point and for gradually transitioning to tracking a second color temperature above the high-luminosity transition point. One such apparatus may also include means for gradually transitioning from tracking a darklight color temperature below a low-luminosity transition point to tracking the first color temperature above the low-luminosity transition point. Another such apparatus may include means for tracking a response curve for a specified chromaticity above a low-luminosity transition point.

Other aspects and advantages of the present invention can be seen upon review of the figures, the detailed description, and the claims that follow.

BRIEF DESCRIPTION OF THE DRAWINGS

The accompanying drawings are for the purpose of illustrating and expounding the features involved in the present invention for a more complete understanding, and not meant to be considered as a limitation, wherein:

FIG. 5 is a table describing color control table generator input parameters according to certain embodiments of the present invention.

DETAILED DESCRIPTION

Figure 1:
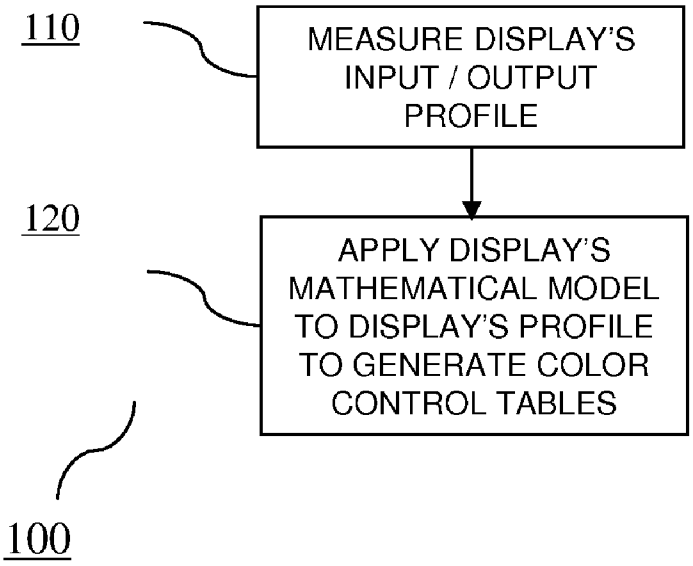
FIG. 1 is a flow chart illustrating methods of color control for display devices according to certain embodiments of the present invention.

Those of ordinary skill in the art will realize that the following description of the present invention is illustrative only and not in any way limiting. Other embodiments of the invention will readily suggest themselves to such skilled persons, having the benefit of this disclosure. Reference will now be made in detail to an implementation of the present invention as illustrated in the accompanying drawings. The same reference numbers will be used throughout the drawings and the following description to refer to the same or like parts.

Unless specifically stated otherwise as apparent from the following discussions, it is appreciated that throughout the present invention, discussions utilizing terms such as "receiving," "determining," "composing," "storing," or the like, refer to the actions and processes of a computer system, or similar electronic computing device. The computer system or similar electronic device manipulates and transforms data represented as physical electronic quantities within the computer system's registers and memories into other data similarly represented as physical quantities within the computer system memories or registers or other such information storage, transmission, or display devices.

Further, certain figures in this specification are flow charts illustrating methods and systems. It will be understood that each block of these flow charts, and combinations of blocks in these flow charts, may be implemented by computer program instructions. These computer program instructions may be loaded onto a computer or other programmable apparatus to produce a machine, such that the instructions which execute on the computer or other programmable apparatus create structures for implementing the functions specified in the flow chart block or blocks. These computer program instructions may also be stored in a computer-readable memory that can direct a computer or other programmable apparatus to function in a particular manner, such that the instructions stored in the computer-readable memory produce an article of manufacture including instruction structures which implement the function specified in the flow chart block or blocks. The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flow chart block or blocks.

Accordingly, blocks of the flow charts support combinations of structures for performing the specified functions and combinations of steps for performing the specified functions. It will also be understood that each block of the flow charts, and combinations of blocks in the flow charts, can be implemented by general- or special-purpose hardware-based computer systems which perform the specified functions or steps, or combinations of general- or special-purpose hardware and computer instructions.

FIG. 1 is a flow chart illustrating methods of color control for display devices according to certain embodiments of the present invention. As shown in FIG. 1, the method begins at step 110 with measuring the display's input-output profile. More details concerning step 110 are discussed later, for example in the context of FIG. 2. Referring back to FIG. 1, the method continues at step 120 by applying a mathematical model of the display to a profile generated by step 110, so as to generate color control tables for the display. More details concerning step 120 are discussed later, for example in the context of FIGS. 3-5. Skilled artisans will recognize that step 120 need not be executed immediately after step 110.

Figure 2:
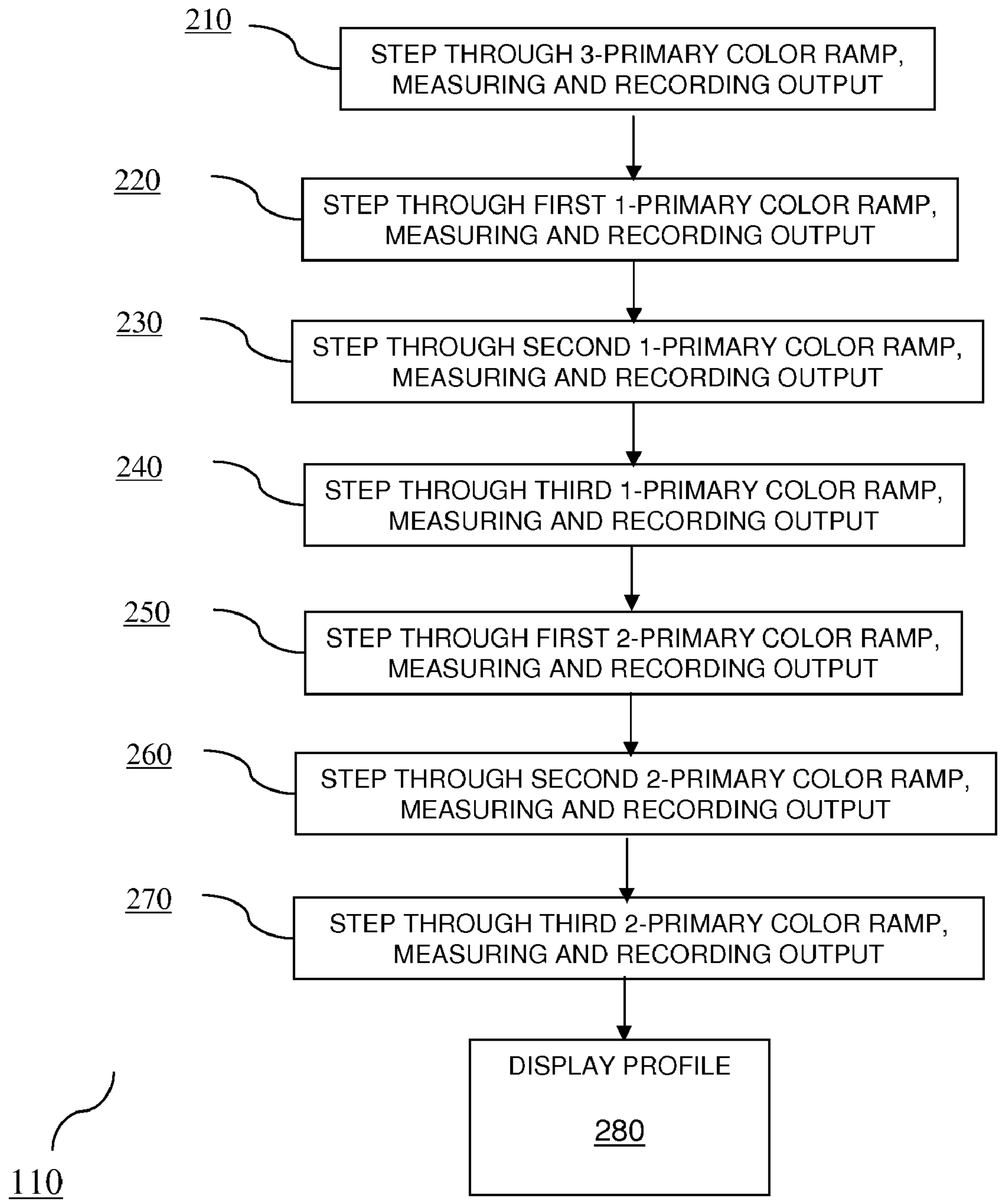
FIG. 2 is a flow chart illustrating methods for display device input/output profile measurement according to certain embodiments of the present invention.

FIG. 2 is a flow chart illustrating methods for display device input/output profile measurement according to certain embodiments of the present invention. FIG. 2 depicts an exemplary profile measurement procedure 110 in one embodiment, as is also generally shown in FIG. 1. Referring to the embodiment shown in FIG. 2, a series of seven color ramps are presented to the display being measured. In one embodiment, each of the three primary color component input values R (red), G (green), and B (blue), consists of an 8-bit code representing numbers spanning the range of values from 0 to 255. In one embodiment, to minimize noise caused by analog inputs, the color ramps are presented to the display via a digital display interface port such as the standard and commercially available DVI ("Digital Visual Interface") input or by controlling the display's internal test pattern generator, if available. In certain embodiments, the color patterns to be generated on the display cover more than a quarter of the display's screen size, or more than the measurement area. Measurements are taken and recorded in one embodiment using a commercially available color analyzer such as the Minolta™ CA-210 Display Color Analyzer. As skilled artisans recognize, such color analyzers measure the brightness and color generated by display devices, and provide the measured color tristimulus values in the well-known X-Y-Z format, among others.

Referring back to FIG. 2, at step 210, the display device under test is presented with the first color ramp, which in one embodiment is a 3-primary ("white") color ramp. For example, in one embodiment, a set of 33 RGB input values are presented to the display device, starting with the highest (i.e., brightest) value for all three primary components (i.e., 255, 255, 255, which would be displayed as white, or near-white), then stepping down by 8 values for all three primary components (i.e., 247, 247, 247), then repeating this process until the value (7, 7, 7) is reached, then finishing with the lowest (i.e., darkest) value (i.e., 0, 0, 0). At each of the 33 steps, the three input RGB values are recorded, along with the resulting measured XYZ values from the color analyzer.

At step 220, the process is repeated with the second color ramp, this time for the first 1-primary color ramp. For example, in one embodiment, a set of 33 RGB input values are presented to the display device, starting with the highest (i.e., brightest) value for one of the primary components and a value of zero for the other two primary components (i.e., 255, 0, 0, which would be displayed as bright red if the red primary component is being stepped), then stepping down by 8 values for the primary component being stepped (i.e., 247, 0, 0), then repeating this process until the value (7, 0, 0) is reached, then finishing with the lowest (i.e., darkest) value (i.e., 0, 0, 0). Again, at each of the 33 steps, the three input RGB values are recorded, along with the resulting measured XYZ values from the color analyzer.

At step 230, the process is repeated with the third color ramp, this time for the second 1-primary color ramp. For example, in one embodiment, a set of 33 RGB input values are presented to the display device, starting with the highest (i.e., brightest) value for another one of the primary components and a value of zero for the other two primary components (i.e., 0, 255, 0, which would be displayed as bright green if the green primary component is being stepped), then stepping down by 8 values for the primary component being stepped (i.e., 0, 247, 0), then repeating this process until value (0, 7, 0) is reached, then finishing with the lowest (i.e., darkest) value (i.e., 0, 0, 0). Again, at each of the 33 steps, the three input RGB values are recorded, along with the resulting measured XYZ values from the color analyzer.

At step 240, the process is repeated with the fourth color ramp, this time for the third 1-primary color ramp. For example, in one embodiment, a set of 33 RGB input values are presented to the display device, starting with the highest (i.e., brightest) value for the third of the primary components and a value of zero for the other two primary components (i.e., 0, 0, 255, which would be displayed as bright blue if the blue primary component is being stepped), then stepping down by 8 values for the primary component being stepped (i.e., 0, 0, 247), then repeating this process until value (0, 0, 7) is reached, then finishing with the lowest (i.e., darkest) value (i.e., 0, 0, 0). Again, at each of the 33 steps, the three input RGB values are recorded, along with the resulting measured XYZ values from the color analyzer.

At step 250, the process is repeated with the fifth color ramp, this time for the first 2-primary color ramp. For example, in one embodiment, a set of 33 RGB input values are presented to the display device, starting with the highest (i.e., brightest) value for two of the primary components and a value of zero for the third primary component (i.e., 255, 255, 0, which would be displayed as bright yellow if the red and green primary components are being stepped), then stepping down by 8 values for the primary components being stepped (i.e., 247, 247, 0), then repeating this process until the value (7, 7, 0) is reached, then finishing with the lowest (i.e., darkest) value (i.e., 0, 0, 0). Again, at each of the 33 steps, the three input RGB values are recorded, along with the resulting measured XYZ values from the color analyzer.

At step 260, the process is repeated with the sixth color ramp, this time for the second 2-primary color ramp. For example, in one embodiment, a set of 33 RGB input values are presented to the display device, starting with the highest (i.e., brightest) value for another set of two of the primary components and a value of zero for the third primary component (i.e., 255, 0, 255, which would be displayed as bright magenta if the red and blue primary components are being stepped), then stepping down by 8 values for the primary components being stepped (i.e., 247, 0, 247), then repeating this process until the value (7, 0, 7) is reached, then finishing with the lowest (i.e., darkest) value (i.e., 0, 0, 0). Again, at each of the 33 steps, the three input RGB values are recorded, along with the resulting measured XYZ values from the color analyzer.

At step 270, the process is repeated with the seventh color ramp, this time for the third and final 2-primary color ramp. For example, in one embodiment, a set of 33 RGB input values are presented to the display device, starting with the highest (i.e., brightest) value for the final set of two of the primary components and a value of zero for the third primary component (i.e., 0, 255, 255, which would be displayed as cyan magenta if the green and blue primary components are being stepped), then stepping down by 8 values for the primary components being stepped (i.e., 0, 247, 247), then repeating this process until the value (0, 7, 7) is reached, then finishing with the lowest (i.e., darkest) value (i.e., 0, 0, 0). Again, at each of the 33 steps, the three input RGB values are recorded, along with the resulting measured XYZ values from the color analyzer.

At step 280, the generated display profile is stored, including all of the input RGB information along with the corresponding measured XYZ information. It should be noted that the darkest value (0, 0, 0) is measured seven times in this exemplary procedure, once for each color ramp. This value is sometimes referred to as the "darklight" of a display, and repeated measurements of the darklight value facilitate more accurate measurement of this value in one embodiment, in which the multiple measurements of the value are averaged. Skilled artisans will recognize that numerous alternative color ramp input and step patterns and may be presented to the display (e.g., in one embodiment, steps 250, 260, and 270 may be optional), that each color ramp may comprise a variety of steps, that the step sizes need not be uniform, and that RGB input value formats other than 8-bit may be accommodated. For example, if the RGB input values are represented by 12-bit codes, skilled artisans will recognize that the ramp values must range between 0 and 4095, instead of between 0 and 255. In one embodiment, the profile measurement procedure 110 is automated under the control of a computer that sequentially generates the input RGB color ramps and records the resulting XYZ color measurements.

As skilled artisans will recognize, at low RGB input values, measurement noise may be larger than the output signal, making the luminance values "bounce" up and down at the low end of the curve. To address this issue, in one embodiment, standard mathematical techniques may be used to process such noisy sequences and impose smoothness and monotonicity while maintaining the shape of the original as well as possible (e.g., by using a least-squares criterion). As a result, the measured luminance is rendered monotonic and smooth.

Figure 3:
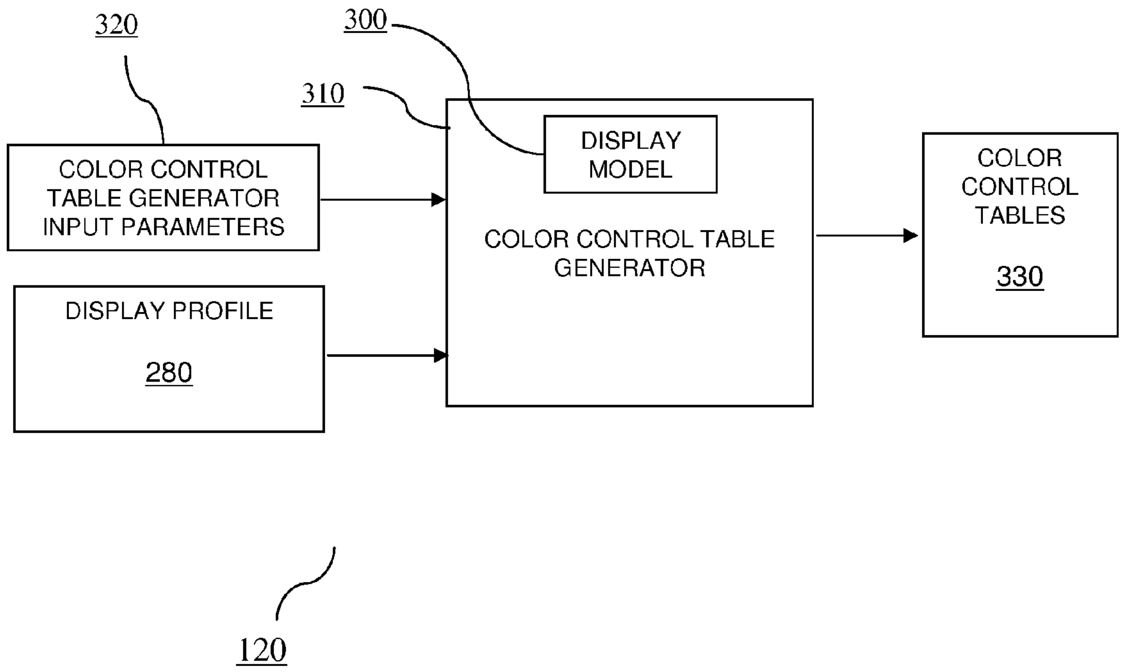
FIG. 3 is a diagram illustrating methods and apparatus for color control table generation for display devices according to certain embodiments of the present invention.

FIG. 3 is a diagram illustrating methods and apparatus for color control table generation for display devices according to certain embodiments of the present invention. As shown in FIG. 3, in one embodiment, color control table generator 310 provides color control tables 330 based on a display profile 280 (which may be provided in accordance with a display profile measurement procedure such as the procedure described above in the context of FIG. 2), and also based on a set of color control table generator input parameters 320 (which will be described in more detail later, for example in the context of FIGS. 4-5). In one embodiment, the operation of color control table generator 310 is also based on application of a mathematical display model 300, which will be described in more detail later. In another embodiment, the operation of color control table generator 310 is based on close-loop trial and error measurement procedures, which may be automated at least in part. For example, RGB input values presented to the display device may be adjusted (e.g., manually or under computer control) until a specified or desired color temperature or XYZ color measurement is achieved, using a color analyzer as a measuring device.

Figure 4:
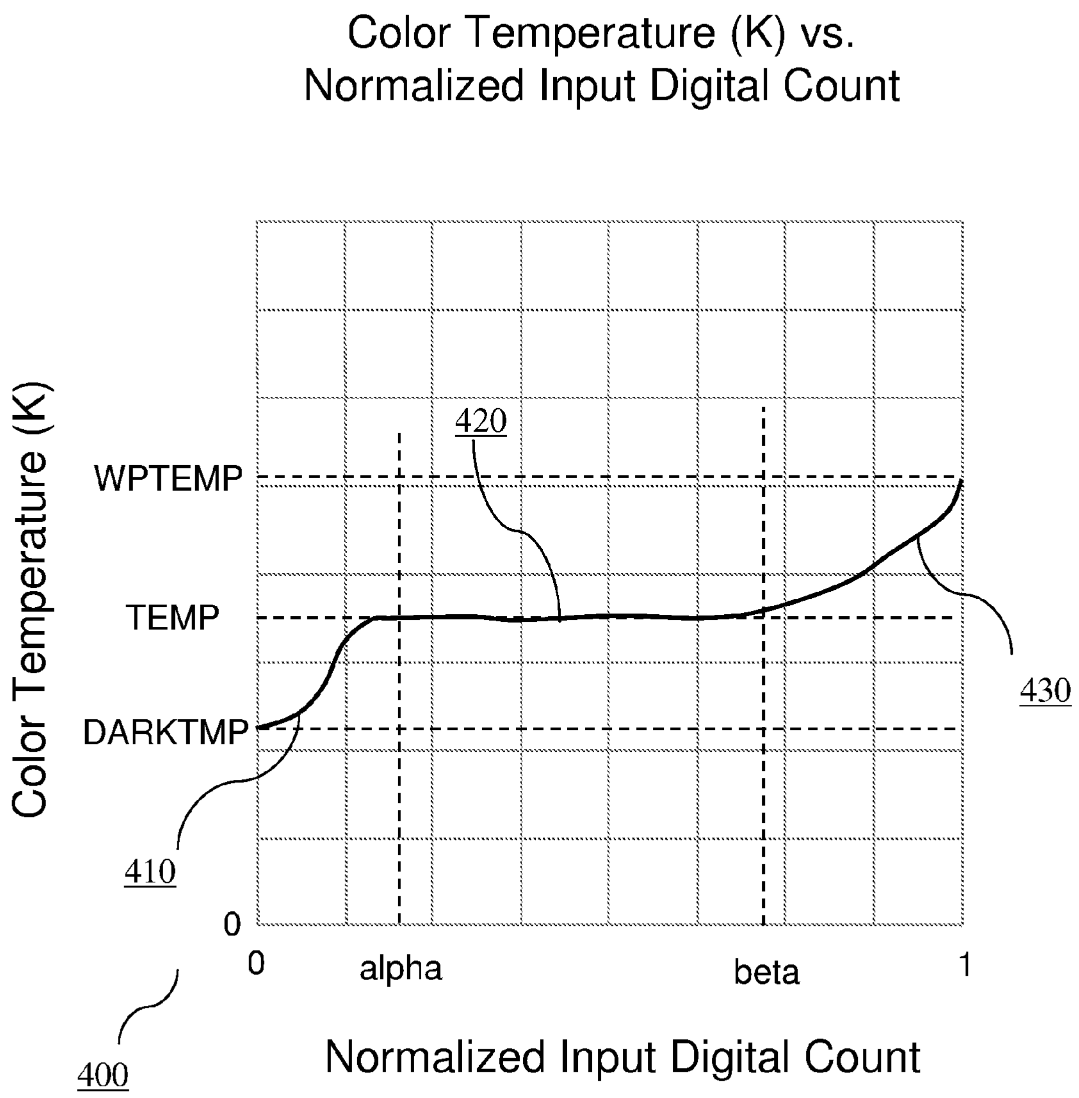
FIG. 4 is a diagram illustrating a color temperature curve according to certain embodiments of the present invention.

FIG. 4 is a diagram illustrating a color temperature curve according to certain embodiments of the present invention. FIG. 4 graphically illustrates techniques according to embodiments of the present invention for increasing brightness at low to medium luminance levels. In FIG. 4, the normalized input digital count (ranging from zero to one) is displayed along the horizontal axis (i.e., with all primary components ramping simultaneously), while the color temperature is displayed along the vertical axis, in Kelvin. An exemplary color temperature curve is shown, which, in the case of FIG. 4 comprises three regions: 410, 420, 430. In one embodiment, the response of the color temperature curve tends to track a target specified correlated color temperature (CCT) in the mid-range of the input region, from alpha to beta as shown for example by the TEMP value in FIG. 4. At input levels higher than a high-level transition point beta, the color temperature curve in one embodiment gradually converges to a color temperature different than TEMP, which may be defined by a target, user-specified color temperature at full brightness (e.g., a whitepoint color temperature, WPTEMP, as shown in FIG. 4). At input levels lower than a low-level transition point alpha, the color temperature curve in one embodiment gradually converges to a color temperature different than TEMP, which may be defined by the color temperature of the display's darklight (e.g., DARKTMP, as shown in FIG. 4).

FIG. 5 is a table describing color control table generator input parameters 320 according to certain embodiments of the present invention. The "TEMP" input parameter in one embodiment represents the target color temperature in the input range between the ALPHA and BETA input values that were shown in FIG. 4 and described earlier. The "WPTEMP" input parameter in one embodiment represents the target color temperature at the end of input range above the BETA input value (i.e., at the top of the input color ramp). In one embodiment, the transition between TEMP and WPTEMP is gradual as the input color ramp increases from BETA to the top of the ramp, and WPTEMP is only reached at the top of the input color ramp. The "ALPHA" input parameter in one embodiment represents the low-end switching point shown in FIG. 4 below which the color control tables 330 begin to yield to the correlated color temperature of the display's darklight, DARKTMP. Thus, in one embodiment a correlated color temperature value of TEMP will be targeted above the ALPHA input value, but below ALPHA the color control tables 330 will make the transition to the correlated color temperature of the darklight. This is because the targeted correlated color temperature TEMP cannot be maintained at the low end of the input ramp, where the darklight typically dominates. In one embodiment, ALPHA is set at the midpoint between 0 and 1, which facilitates a gradual transition. In another embodiment, ALPHA may be set at approximately "48" on scale from 0 to 255 (i.e., approximately 20% of the maximum value).

In one embodiment, the "BETA" input parameter acts in conjunction with WPTEMP at input values above BETA. In one embodiment, ALPHA should be greater than zero, ALPHA should be less than BETA, and BETA should be less than one (i.e., the top of the input color ramp). In one embodiment, BETA may be set at approximately "235" on scale from 0 to 255 (i.e., approximately 90% of the maximum value). If BETA is assigned a positive value but WPTEMP is not, in one embodiment then WPTEMP will take the correlated color temperature of the display's whitepoint (i.e., the color temperature when all three primary color components are set to their brightest values).

In one embodiment, the "CHROM" (or "chromaticity") input parameter may be specified instead of TEMP. CHROM is specified in terms of a pair of floating-point chromaticity coordinates between zero and one in one embodiment. In one embodiment, if CHROM is specified, the color control table generator ignores the settings for TEMP, WPTEMP, BETA, and HWID (a setting that is described in more detail below). Instead, in such an embodiment, the generated color control tables 330 may target the response curve for the specified chromaticity over the range from ALPHA to one. In one embodiment, if neither WPTEMP nor BETA is explicitly assigned, then high-end brightening may not be attempted, and the target TEMP correlated color temperature temp will persist from ALPHA to one ("top of the ramp"). Assigning either WPTEMP or BETA a positive value in one embodiment triggers the mechanism to attempt high-end brightening. If only WPTEMP is given a positive value, BETA will be assigned 0.8 in one embodiment.

In one embodiment, if the "HWID" input parameter is omitted or assigned the value zero, the specified color temperature TEMP is found on the Planckian locus known to skilled artisans. If HWID (i.e., "half-width") is a positive value, in one embodiment it defines a distance on either side of the Planckian locus, in CIE 1960 uv coordinates, which will be searched for candidates. The candidate chosen is the one that produces the brightest image. For example, in one embodiment HWID may be set to 0.01. Skilled artisans will recognize that large values of HWID may produce colors very different from the one on the Planckian locus, and that the fact that these colors match the specified color temperature is meaningless in such cases.

The TLEN input parameter specifies the color control table length in one embodiment (e.g., 256 or 1024 values).

The GAMMA input value defines the exponent in the power-law curve $y=x^{GAMMA}$ which it is desired to enforce as the normalized luminance response for each of the monitor channels, and may be effective only if GAMFILE (described next) is not specified. In one embodiment, the default value of GAMMA is 2.2.

The GAMFILE input parameter, in one embodiment, identifies an input file that defines the gamma curve and overrides any setting of GAMMA. In one embodiment, the GAMFILE format comprises pairs of input digital count values along with the corresponding luminance. In one embodiment, the corresponding luminance may be the result of a gray-scale measurement where all three input channels have the same indicated pixel value.

The NBITS input parameter, in one embodiment, specifies the bit-width of the output color control tables, defaulting to 10 in one embodiment. The NUMSEGS input parameter is used in one embodiment in a data-smoothing operation, with a default value of 5. In one embodiment, NUMSEGS is related to the number of segments in a spline, using cubic spline interpolation techniques known to skilled artisans, for smoothing the data and for imposing monotonicity.

Exemplary derivation of mathematical display model 300 (as shown in FIG. 3) is now described in more detail. In one embodiment, described below, display model 300 comprises a linear, a quadratic, and a nonparametric model. Such an embodiment is based on normalized variables in the range 0 to 1. (i.e., each of the input RGB primary channels is normalized). As skilled artisans will recognize, dependent variables that are monotonically increasing (such as luminance, once properly adjusted) can be normalized by shifting (to start at 0) and rescaling (to end at 1). To begin, RGB triplets are normalized, meaning that each of R, G, and B components is a real number in the unit interval $I=[0,1]$, rather than a digital count in the range from 0 to 255, for example. One exemplary model deals with two separate RGB color spaces: the input space C and the monitor space M. As used herein, "monitor" may refer to a variety of display devices based on various display technologies known in the art, such as liquid crystal displays ("LCDs") used as computer monitors or television sets, for example. Each space consists of RGB triplets in the unit-cube $I^3$, but C is an abstract space whose primaries are lacking colorimetric definition, whereas a triplet $m \in M$ produces a real light with measurable CIE-XYZ tristimulus coordinates. This output color space is called T herein.

The model in one embodiment consists of two parts. First, the mapping $\psi$ between M and $\tau$ is specified. This mapping describes how each monitor space triplet m is transformed into an XYZ triplet $\tau \in T$. Second, the mapping $\phi$ between C and M is specified. This mapping describes how an input (r, g, b) triplet is transformed into the associated monitor space triplet that determines the final color.

Based on real-display observations, the following model for the $\psi$: M→T mapping may be described. There is a measurable light d∈T that is observed even when the input color (and therefore also the monitor color) is identically zero, referred to as the darklight, as mentioned earlier. In certain monitors (called "linear monitors" here), the output color τ∈T consists of two parts: a controlled color λ that varies linearly with monitor color m, and the fixed offset d. In linear monitors, there is a 3×3 matrix A such that $$\tau=\psi(m)=\lambda+d=Am+d \tag{1}$$

Note that elements of M and T as treated as column vectors. The columns of matrix A are the XYZ coordinates of the three monitor primaries $P_1$, $P_2$, $P_3$. If m $[m_1\ m_2\ m_3]^T$, then a weighted sum of the three columns of A can be described as follows:

$$Am=[\,P_1\quad P_2\quad P_3\,]\begin{bmatrix} m_1\\ m_2\\ m_3\end{bmatrix}=m_1P_1+m_2P_2+m_3P_3 \tag{2}$$

Each $P_i$ can be written out as $P_i=[X_i\ Y_i\ Z_i]^T$, so that:

$$A=\begin{bmatrix} X_1 & X_2 & X_3\\ Y_1 & Y_2 & Y_3\\ Z_1 & Z_2 & Z_3\end{bmatrix} \tag{3}$$

The mapping $\phi$: C→M is non-linear and generally more complex. In one embodiment, display model 300 applies a separability hypothesis, which includes first the following simplifying assumption of channel independence:

$$\phi(c)=m \Leftrightarrow m_i=\phi_i(c_i),\ i=1,2,3 \tag{4}$$

In other words, in one embodiment, each component of c∈C is mapped into the corresponding primary component of m∈M without regard for the behavior of the other components. The second part of the separability hypothesis is the further assumption that each of the component functions $\phi_i$ is a continuous increasing mapping of I onto I, where the subjective "onto" requirement implies the following relationships:

$$\begin{cases} \varphi_i(0)=0\\ \varphi_i(1)=1\end{cases} \tag{5}$$

This now implies, as suggested earlier, that $$c=[000]^T \Rightarrow m=\phi(c)=[000]^T \Rightarrow \tau=\psi(m)=d \tag{6}$$

With the above exemplary analytical framework in mind, embodiments of display characterization/modeling techniques based on a measured display input/profile can be described. The goal of these procedures is to ascertain the overall mapping from RGB-based input space C to CIE-XYZ-based output space T, and this is accomplished in one embodiment by determining the mappings $\phi$: C→M from input to monitor space and $\psi$: M→T from monitor to output space.

Beginning with $\psi$, it should be noted from equations (1) through (3) above that linear monitors are characterized by the darklight d and the matrix A—equivalently, the tristimulus values associated with each of the monitor primaries. The separability hypothesis discussed above facilitates measuring d directly in one embodiment. That is, from equation (6), the only requirement is to present the monitor with input $c=[000]^T$. Subsequently, the primaries may be measured. For example, in the case of the red primary channel, according to equation (5), $C=[100]^T$ maps into $m=[100]^T$, such that in accordance with equation (1), the following relationship may be derived:

$$\tau=Am+d=[\,P_1\quad P_2\quad P_3\,]\begin{bmatrix} 1\\ 0\\ 0\end{bmatrix}+d=P_1+d \tag{7}$$

In equation (7) above, the left-hand-side, τ, is the measured output. $P_1$ is deduced by subtracting d. In like manner the other primaries are determined. Hence, A and therefore the mapping $\psi$ are known.

In one embodiment, to determine the input-to-monitor space mapping, $\phi$, each of the component functions $\phi_1$, $\phi_2$, $\phi_3$ must be obtained. Focusing on the red channel as an example, an interpolated solution for $\phi_1$ may be derived, based on measurements made at a sequence of points $\mathbf{0}\leqq t_1\leqq t_2< \ldots <t_n\leqq 1$. If t is one of these points, $m_1=\phi_1(t)$ may be measured as follows. Equation (7) above generalizes in this case to:

$$\tau=[\,P_1\quad P_2\quad P_3\,]\begin{bmatrix} m_1\\ 0\\ 0\end{bmatrix}+d=m_1P_1+d \tag{8}$$

where, as before, τ on the left is the measurement value which is therefore known. At this point, $P_1$ and d are also known, so $m_1$ is deducible. Moreover, a scalar relation may also be derived from equation (8) above. All three vectors shown—τ, $P_1$,d—exist in the output space T of XYZ tristimulus values. The Y component contains all the luminance information. Hence by taking luminance components in equation (8), the following scalar relation may be expressed:

$$\tau_Y=m_1Y_1+d_Y \tag{9}$$

In equations (8) and (9) above, the following notation was used:

$$\tau=\begin{bmatrix} \tau_X\\ \tau_Y\\ \tau_Z\end{bmatrix},\ P_1=\begin{bmatrix} X_1\\ Y_1\\ Z_1\end{bmatrix},\ d=\begin{bmatrix} d_X\\ d_Y\\ d_Z\end{bmatrix} \tag{10}$$

If in equation (9), $\tau_Y$ is rewritten as $L_1(t)$ (meaning the measured luminance resulting from input $C=[t\ 00]^T$), then the following equation may be expressed:

$$m_1=\varphi_1(t)=\frac{L_1(t)-d_Y}{Y_1} \tag{11}$$

The same formula is also valid with all the subscripts 1 replaced by 2 or 3. This equation (with i now replacing 1) can be rewritten in the following form, recognizing that $d_Y=L_i(0)$ for any i=1,2,3 and that $Y_i=L_i(1)-d_Y$:

$$m_i = \varphi_i(t) = \frac{L_i(t) - L_i(0)}{L_i(1) - L_i(0)} \tag{12}$$

Equation (12) above, along with the understanding that the luminance $L_i(t)$ increases with t, indicates that $m_i=\phi_i(t)$ increases from 0 to 1 as t increases from 0 to 1. In other words, $\phi_i$: I→I is increasing and onto as required by the separability hypothesis described earlier. Thus, output luminance increases as the input channel increases from 0 to 1. As mentioned earlier, skilled artisans will recognize that noisy data sometimes fails to adhere to this requirement because at low input values, measurement noise may be larger than the output signal, making the luminance values "bounce" up and down at the low end of the curve. In one embodiment, mathematical techniques may be used to process such noisy sequences and impose smoothness and monotonicity while maintaining the shape of the original as well as possible (e.g., by using a least-squares criterion). As a result, the measured luminance (i.e., the Y component of the XYZ tristimulus values) is rendered monotonic and smooth in preparation for normalization.

In one example, S can describe the sequence to be processed, whose terms are S(1), S(2), . . . , S(N). This is an increasing sequence, indicating that S(1) is the smallest term and that S(N) is the largest. All terms are first shifted by subtracting S(1) from each term in place, then each term is divided by the largest term, (S(N)-S(1)). This procedure is performed for the three input channels, converting the input RGB values into normalized values that increase monotonically from 0 to 1 as the corresponding RGB input values increase from 0 to 1. Such normalized values may be called the "linearized luminance" of each color channel, meaning that a normalized value of 0.5 actually indicates 50% of maximum brightness (except for the offset, which comes from the darklight and is usually regarded as small).

In one embodiment, the following requirements are imposed in mapping RGB input values to linearized luminance values for each color channel: First, the RGB input values and the linearized luminance values should be strictly increasing, meaning that if one RGB input value is smaller than a second RGB input value, the linearized luminance value corresponding to the first RGB input value should also be smaller than the linearized luminance value corresponding to the second RGB input value. Second, the mapping is onto, so that 0 is mapped to 0 and 1 is mapped to 1. If the mappings satisfy these conditions, then they are invertible, as skilled artisans will recognize.

For linear monitors, the CCT can be controlled using a diagonal scaling matrix to adjust the relative strengths of the R, G, and B channels if all channels share a common normalized luminance response. That can be achieved with a single lookup table, independent of the target CCT. For example, consider the case of a monitor with an input-to-monitor space mapping $\phi$ that is considered unsatisfactory, while a more suitable mapping $\bar{\phi}$ is desired. For example, in $\bar{\phi}$, all channels may follow a common response curve, but not in $\phi$. In such an embodiment, the input $c\epsilon C$ may be preprocessed by a transformation $\Gamma$: C→C such that the effect of $\psi$ on $\Gamma(c)$ is the same as the desired effect of $\underline{\psi}$ on c:

$$\phi(\Gamma(c))\equiv\bar{\phi}(c) \tag{13}$$

In symbolic terms, the predistortion mapping F is the inverse of $\phi$ composed with $\bar{\phi}$:

$$\Gamma=\phi^{-1}\circ\bar{\psi} \tag{14}$$

or, in classical functional notation, $$\Gamma(c)=\phi^{-1}(\bar{\phi}(c)). \tag{15}$$

From the above, the following expression may be derived, where, at the last step, the fact that the composition $(\phi\circ\phi^{-1})$ is the identity transformation is used:

$$\phi(\Gamma(c))=(\phi\circ\Gamma)(c)=(\phi\circ(\phi^{-1}\circ\bar{\phi}))(c)=((\phi\circ\phi^{-1})\circ\bar{\phi}(c)=\bar{\phi}(c) \tag{16}$$

Due to the separability hypothesis, these relations can be read as scalar equations applied to each of the three channels individually. Thus three mappings $\phi_i$: I→I are derived, along with one target mapping $\bar{\phi}$: I→I shared by them all. Then the LUT (lookup table) will have three columns, the i'th representing the transformation $\phi_i^{-1}\circ\bar{\phi}$, In one embodiment, $\bar{\phi}$ is a gamma curve with a specified value of $\gamma$:

$$\bar{\phi}(s)=s^\gamma \tag{17}$$

Each of the functions $\phi_i$ is known from a tabulation of measurements. Swapping the columns of that table provides an interpolation scheme for $\phi_i^{-1}$. Starting with a linear ramp on s from 0 to 1, equation (17) may be applied in one embodiment to create the target, followed by $\phi_i^{-1}$, the results going into column i of the look-up table. Thus, by using a look-up table as described above, a monitor may be treated as if each of its channel mappings were a gamma curve with a common value of $\gamma$ selected in advance.

It should be noted that certain monitors do not follow a linear output-stage formula. For example, embodiments of the present invention may be employed in the context of monitors that adhere to a quadratic output-stage formula. Display model 300 (as shown in FIG. 3) may be extended to encompass quadratic monitor behavior in one embodiment, considering normalized X, Y, Z coordinates for each channel (with Y already coinciding with the monitor coordinate m for that channel). In one embodiment, nonlinearity parameters $v_x$ (nu_sub_X) and $v_z$ are introduced, such that:

$$\begin{cases} X = (1 - v_X)m + v_X m^2 \\ Y = m \\ Z = (1 - v_Z)m + v_Z m^2 \end{cases} \tag{18}$$

The above form of quadratic expression is indicated by the requirement of mapping 0 into 0 and 1 into 1, as described earlier. If should be noticed that this display model embodiment reduces to the linear case when $v_x$ and $v_z$ are both 0. Both can be of either sign, and their magnitude determines the degree of departure from linearity. Thus, a quadratic display model may replace the linear model in one embodiment, which it subsumes as a special case. Six new parameters may be introduced and fitted to the profile data: $v_x$ and $v_z$ for each of the three channels. These parameters may be computed directly from the profile data, and for linear monitors these six quantities are all very close to 0. In one embodiment of a quadratic display model, calculations based on equation (18) above replace the matrix multiplication in converting from display to output coordinates, and the darklight is added in as a final step.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method comprising:
- measuring color values generated in a display device in response to a series of color ramps being input into the display device;
- generating a display color profile based on the measured color values; and
- generating color control tables for the display device based, at least in part, on the display color profile and a plurality of color control table generator input parameters, wherein the plurality of color control table generator input parameters include a plurality of color temperatures corresponding to predetermined luminosity input values.

2. The method for of claim 1, further comprising tracking a specified chromaticity above a low-luminosity transition point.

3. The method of claim 2, further comprising tracking the specified chromaticity below a high-luminosity transition point.

4. The method of claim 2, further comprising tracking the specified chromaticity below a high-luminosity transition point, wherein the high-luminosity transition point is set at a value of about 90% of a maximum luminosity input value.

5. The method of claim 2, further comprising tracking the specified chromaticity below a high-luminosity transition point, wherein the high-luminosity transition point is set at a value of about 90% of a maximum luminosity input value and the low-luminosity transition point is set at a value of about 20% of the maximum luminosity input value.

6. The method of claim 1, further comprising:
- tracking a first color temperature below a high-luminosity transition point; and
- transitioning to tracking a second color temperature above the high-luminosity transition point.

7. The method of claim 6, further comprising:
- transitioning from tracking a darklight color temperature below a low-luminosity transition point to tracking the first color temperature above the low-luminosity transition point.

8. The method of claim 6, wherein the high-luminosity transition point is set at a value of about 90% of a maximum luminosity input value.

9. The method of claim 7, wherein the low-luminosity transition point is set at a value of about 20% of a maximum luminosity input value.

10. The method of claim 9, wherein the high-luminosity transition point is set at a value of about 90% of the maximum luminosity input value.

11. The method of claim 6, wherein the first color temperature and the second color temperature are approximately the same.

12. An apparatus comprising:
- means for measuring color values generated in a display device in response to a series of color ramps being input into the display device;
- means for generating a display color profile based on the measured color values; and
- means for generating color control tables for the display device based, at least in part, on the display color profile and a plurality of color control table generator input parameters, wherein the plurality of color control table generator input parameters include a plurality of color temperatures corresponding to predetermined luminosity input values.

13. The apparatus of claim 12, further comprising means for tracking a specified chromaticity above a low-luminosity transition point.

14. The apparatus of claim 13, further comprising means for tracking the specified chromaticity below a high-luminosity transition point.

15. The apparatus of claim 13, wherein the low-luminosity transition point is set at a value of about 20% of a maximum luminosity input value.

16. The apparatus of claim 14, wherein the high-luminosity transition point is set at a value of about 90% of a maximum luminosity input value.

17. The apparatus of claim 12, further comprising:
- means for tracking a first color temperature below a high luminosity transition point; and
- means for transitioning to tracking a second color temperature above the high-luminosity transition point.

18. The apparatus of claim 17, further comprising:
- means for transitioning from tracking a darklight color temperature below a low-luminosity transition point for to tracking the first color temperature above the low-luminosity transition point.

19. The apparatus of claim 17, wherein the high-luminosity transition point is set at a value of about 90% of a maximum luminosity input value.

20. The apparatus of claim 18, wherein the low-luminosity transition point is set at a value of about 20% of a maximum luminosity input value.

21. The apparatus of claim 20, wherein the high-luminosity transition point is set at a value of about 90% of the maximum luminosity input value.

22. An article of manufacture including a computer-readable medium having instructions stored thereon that, in response to execution by a computing device, cause the computing device to:
- measure color values generated in a display device in response to a series of color ramps being input into the display device;
- generate a display color profile based on the measured color values; and
- generate color control tables for the display device based, at least in part, on the display color profile and a plurality of color control table generator input parameters, wherein the plurality of color control table generator input parameters include a plurality of color temperatures corresponding to predetermined luminosity input values.

23. An apparatus, comprising:
- a color analyzer configured to measure color values generated in a display device in response to a series of color ramps being input into the display device;
- a display profile generator configured to generate a display color profile based on the measured color values; and
- a color control table generator coupled to the display profile generator and configured to receive the display color profile and a plurality of input parameters, wherein the plurality of input parameters include a plurality of color temperatures corresponding to particular luminosity input values, and wherein the color control table generator is further configured to generate color control tables based, at least in part, on the display color profile and the plurality of input parameters.

* * * * *

24. The apparatus of claim 23, further comprising a color controller configured to track a first color temperature below a high-luminosity transition point and to transition to tracking a second color temperature above the high-luminosity transition point.

25. The apparatus of claim 24, wherein the first color temperature is approximately the same as the second color temperature.

26. The apparatus of claim 24, wherein the color controller is further configured to transition from tracking a darklight color temperature below a low-luminosity transition point to tracking the first color temperature above the low-luminosity transition point.

* * * * *

UNITED STATES PATENT AND TRADEMARK OFFICE

CERTIFICATE OF CORRECTION

PATENT NO. : 7,969,449 B2
APPLICATION NO. : 11/874167
DATED : June 28, 2011
INVENTOR(S) : Moldvai et al.

It is certified that error appears in the above-identified patent and that said Letters Patent is hereby corrected as shown below:

Title page, item (75), under “Inventors”, in Column 1, Line 2, delete “Mathew D. Halfant,” and insert -- Matthew D. Halfant, --.

Column 13, line 20, in Claim 2, delete “method for of” and insert -- method of --.

Column 13, line 58, in Claim 12, delete “apparatus” and insert -- apparatus, --.

Column 14, lines 24-25, in Claim 18, delete “point for to” and insert -- point to --.

Signed and Sealed this
Tenth Day of January, 2012

David J. Kappos
*Director of the United States Patent and Trademark Office*